(12) United States Patent
Oooka et al.

(10) Patent No.: US 10,205,110 B2
(45) Date of Patent: Feb. 12, 2019

(54) PHOTOELECTRIC CONVERSION ELEMENT AND MANUFACTURING METHOD OF PHOTOELECTRIC CONVERSION ELEMENT

(71) Applicant: Kabushiki Kaisha Toshiba, Minato-ku (JP)

(72) Inventors: Haruhi Oooka, Kawasaki (JP); Hideyuki Nakao, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/075,407

(22) Filed: Mar. 21, 2016

(65) Prior Publication Data
US 2016/0285023 A1 Sep. 29, 2016

(30) Foreign Application Priority Data
Mar. 24, 2015 (JP) .................................. 2015-061587

(51) Int. Cl.
*H01L 31/0224* (2006.01)
*H01L 31/00* (2006.01)
(Continued)

(52) U.S. Cl.
CPC ........ *H01L 51/441* (2013.01); *H01L 31/0224* (2013.01); *H01L 31/022425* (2013.01);
(Continued)

(58) Field of Classification Search
CPC .. H01L 51/441; H01L 51/0021; Y02E 10/549
See application file for complete search history.

(56) References Cited

U.S. PATENT DOCUMENTS

2008/0276980 A1* 11/2008 Ogasahara ...... H01L 31/022425
136/244
2010/0300513 A1* 12/2010 Mihaila ............... H01L 51/4226
136/252
(Continued)

FOREIGN PATENT DOCUMENTS

JP 7-321354 A 12/1995
JP 2009-260400 11/2009
(Continued)

OTHER PUBLICATIONS

Steim et al., "Interface materials for organic solar cells," J. Mater. Chem, 2010, 20, 2499-2512.*
(Continued)

*Primary Examiner* — Angelo Trivisonno
(74) *Attorney, Agent, or Firm* — Oblon, McClelland, Maier & Neustadt, L.L.P.

(57) ABSTRACT

A photoelectric conversion element includes: a substrate having an element formation surface; a first electrode provided on the element formation surface and extending along one direction of the element formation surface up to an end portion of the element formation surface; a photoelectric conversion layer provided above the first electrode and including a first region having a first thickness and a second region extending from an end portion of the first region up to an end portion of the first electrode and having a second thickness larger than the first thickness; and a second electrode provided above the first and second regions and extending up to an end portion of the photoelectric conversion layer.

11 Claims, 9 Drawing Sheets

(51) Int. Cl.
  *H01L 21/00*  (2006.01)
  *H01L 51/44*  (2006.01)
  *H01L 51/00*  (2006.01)

(52) U.S. Cl.
  CPC ........ *H01L 51/0021* (2013.01); *Y02E 10/549* (2013.01); *Y02P 70/521* (2015.11)

(56) References Cited

U.S. PATENT DOCUMENTS

| | | | |
|---|---|---|---|
| 2012/0080675 A1* | 4/2012 | Nakatani | H01L 27/307 257/53 |
| 2014/0137919 A1 | 5/2014 | Nakao et al. | |
| 2014/0216519 A1* | 8/2014 | Watanabe | B26D 1/08 136/244 |

FOREIGN PATENT DOCUMENTS

| | | |
|---|---|---|
| JP | 2011-96914 | 5/2011 |
| JP | 2013-89659 | 5/2013 |
| JP | 2014-96485 A | 5/2014 |
| JP | 2014-103153 A | 6/2014 |
| WO | WO 2014/181765 A1 | 11/2014 |

OTHER PUBLICATIONS

Japanese Office Action dated Nov. 1, 2016 in Patent Application No. 2015-061587 (with English translation).

* cited by examiner

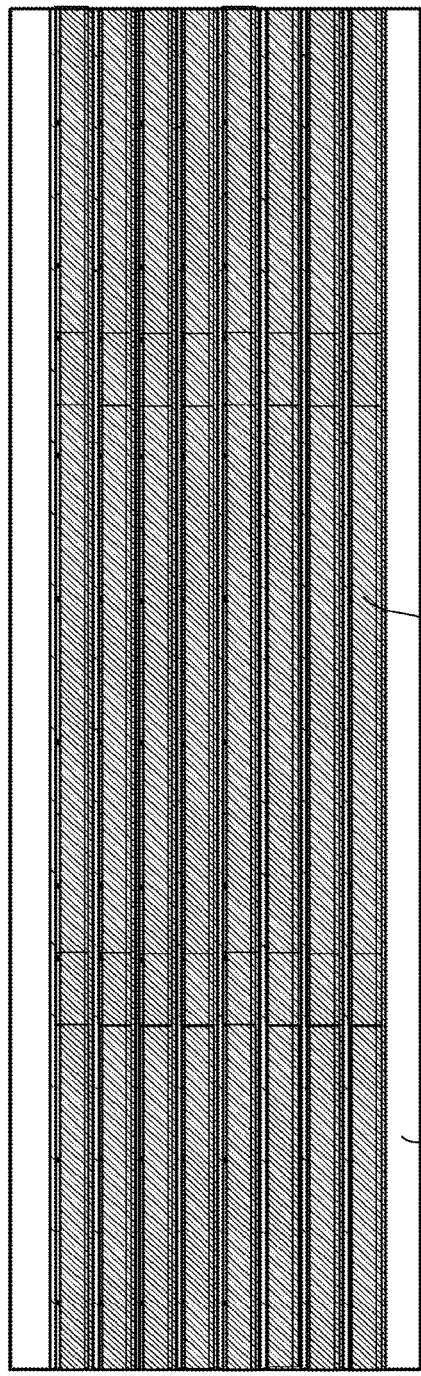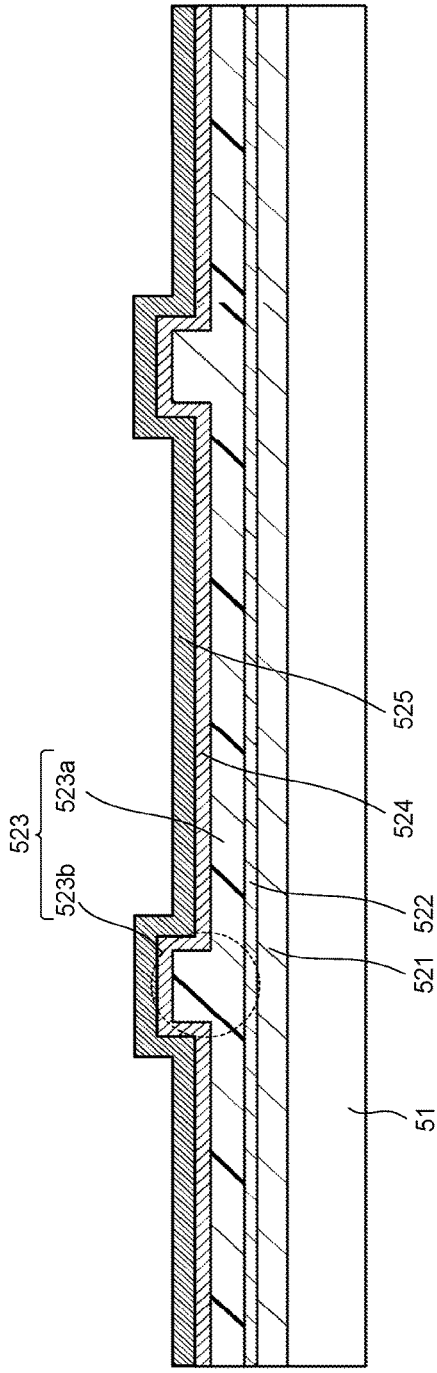

PHOTOELECTRIC CONVERSION ELEMENT AND MANUFACTURING METHOD OF PHOTOELECTRIC CONVERSION ELEMENT

CROSS REFERENCE TO RELATED APPLICATION

This application is based upon and claims the benefit of priority from Japanese Patent Application No. 2015-061587, filed on Mar. 24, 2015; the entire contents of which are incorporated herein by reference.

Field

Embodiments disclosed herein relate generally to a photoelectric conversion element and a manufacturing method of the photoelectric conversion element.

Background

A photoelectric conversion element such as an organic photovoltaics using an organic semiconductor is expected as a low-cost photovoltaics because an inexpensive coating method can be employed for forming its photoactive layer. Cells forming the organic photovoltaics each have a structure in which a transparent electrode and a counter electrode sandwich the photoactive layer, for instance.

A possible way to enhance power conversion efficiency of a photoelectric conversion element is, for example, to increase an area ratio of a photoelectric conversion region. On the other hand, in a conventional photoelectric conversion element, a region not contributing to photoelectric conversion is produced in an end portion of a substrate due to a problem in a manufacturing process. In order to make the photoelectric conversion region large, it is required not only to increase the size of the photoelectric conversion element but also to make the aforesaid region not contributing to the photoelectric conversion as small as possible.

BRIEF DESCRIPTION OF THE DRAWINGS

FIG. 6A and FIG. 6B are schematic explanatory views of the example of the manufacturing method of the photoelectric conversion element.

DETAILED DESCRIPTION

A photoelectric conversion element of an embodiment includes: a substrate having an element formation surface; a first electrode provided on the element formation surface and extending along one direction of the element formation surface up to an end portion of the element formation surface; a photoelectric conversion layer provided above the first electrode and including a first region having a first thickness and a second region extending from an end portion of the first region up to an end portion of the first electrode and having a second thickness thicker than the first thickness; and a second electrode provided above the first and second regions and extending up to an end portion of the photoelectric conversion layer.

Hereinafter, an embodiment will be described with reference to the drawings. Note that the drawings are schematic, and for example, a relation of thickness and planar dimension, a thickness ratio among layers, and so on are sometimes different from actual ones. Further, in the embodiment, substantially the same constituent elements are denoted by the same reference signs and a description thereof will be omitted.

Figure 1:
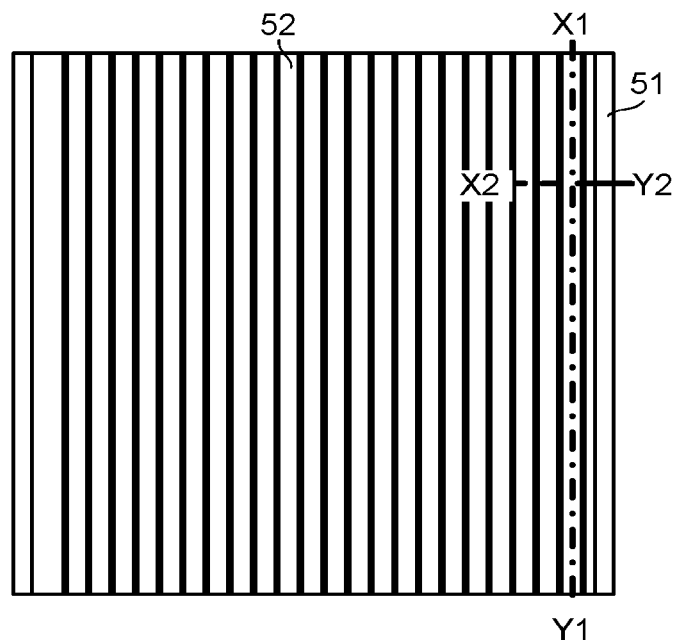
FIG. 1 is a schematic view illustrating a structure example of a photoelectric conversion element.
Figure 2:
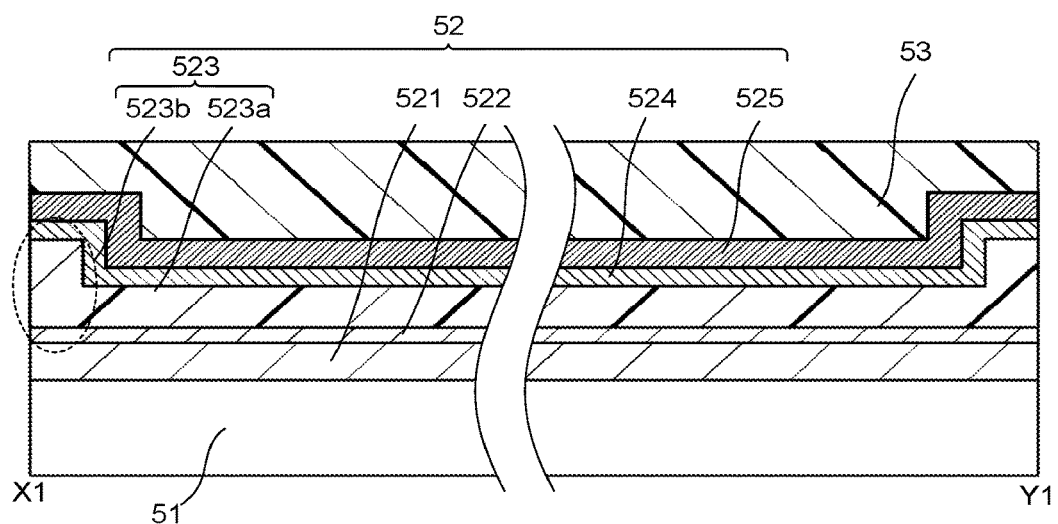
FIG. 2 is a schematic view illustrating the structure example of the photoelectric conversion element.
Figure 3:
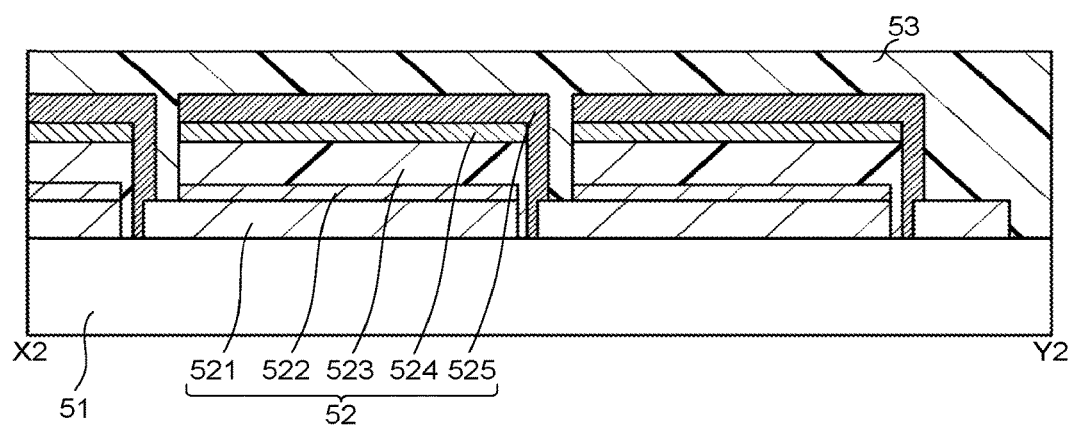
FIG. 3 a schematic view illustrating the structure example of the photoelectric conversion element.

FIG. 1 to FIG. 3 are schematic views illustrating a structure example of the photoelectric conversion element. FIG. 1 is a schematic plane view, FIG. 2 is a schematic sectional view taken along X1-Y1 line in FIG. 1, and FIG. 3 is a schematic sectional view taken along X2-Y2 line in FIG. 1.

The photoelectric conversion element illustrated in FIG. 1 to FIG. 3 includes a plurality of strip-shaped cells 52 provided on a substrate 51 and a sealing part 53 sealing the cells 52. Incidentally, the sealing part 53 may be provided so as to surround the cells 52, and a counter substrate may be provided on the sealing part 53. Further, the sealing part 53 does not necessarily have to be provided.

The substrate 51 has an element formation surface. As the substrate 51, a substrate of: an inorganic material such as non-alkali glass or quartz glass; plastic such as polyethylene, polyethylene terephthalate (PET), polyethylene naphthalate (PEN), polyimide, polyamide, polyamide-imide, a liquid crystal polymer, or a cycloolefin polymer; a polymer film; or the like is usable, for instance. Preferably, the substrate 51 allows the formation of electrodes thereon and does not easily change in quality by heat and an organic solvent. In a case where light is made to enter via the substrate 51, the substrate 51 has a light transmitting property. Further, this is not restrictive, and a stainless steel (SUS) substrate, a silicon substrate, a metal substrate, or the like is usable, for instance. At this time, at least part of a flat surface of the substrate 51 preferably has an insulated surface. A thickness of the substrate 51 is not particularly limited, provided that the substrate 51 has strength high enough to support other constituent members.

The plural cells 52 are electrically connected in series. This can increase an output voltage. Note that the number of the cells 52 is not limited to the number as indicated in FIG. 1.

Further, a structure example of the cells 52 will be cells 52 each have an electrode 521, an intermediate layer 522, a photoactive layer 523, an intermediate layer 524, and an electrode 525. The photoactive layer 523 has a function as a photoelectric conversion layer having a function of performing charge separation by energy of light such as sunlight with which the photoactive layer 523 is irradiated.

The electrodes 521 are provided on the element formation surface of the substrate 51 and extend along one direction of the element formation surface up to an end portion of the element formation surface. The plural electrodes 521 are preferably separated from one another. As the electrode 521, a metal oxide material such as indium oxide, zinc oxide, tin oxide, indium-tin oxide (ITO), fluorine-containing tin oxide (FTO), or indium-zinc oxide, or a metal material such as gold, platinum, silver, copper, aluminum, molybdenum, titanium, tungsten, manganese, cobalt, nickel, or tin is usable, for instance. In a case where light is made to enter via the substrate 51, the electrode 521 preferably has a light transmitting property, and especially preferably ITO or FTO is used. Further, as the electrode material, polyaniline being an organic conductive polymer and its derivative, polythiophene and its derivative, or the like may be used. The electrode 521 may be composed of a single layer or multiple layers.

The intermediate layer 522 is provided on the electrode 521 and extends along the one direction of the element formation surface up to an end portion of the electrode 521. The intermediate layer 522 has a function as one of an electron transport layer and a hole transport layer, and the like.

The hole transport layer has a function of efficiently transporting holes, a function of preventing excitons generated near an interface of the photoactive layer 523 from disappearing, and so on. As the hole transport layer, a polythiophene-based polymer such as PEDOT/PSS (poly(3,4-ethylenedioxythiophene)-poly(styrenesulfonate) or an organic conductive polymer such as polyaniline or polypyrrole is usable. Further, as the hole transport layer, an inorganic material such as molybdenum oxide or tungsten oxide may be used. The inorganic material such as molybdenum oxide is formed by using a vacuum deposition method or the like, for instance. Further, by applying a coating solution of a precursor and thereafter causing a reaction by heating or the like, it is possible to form a film of the inorganic material.

The organic conductive polymer is formed by using a coating method or the like, for instance. For example, by forming a coating layer with a desired thickness made of a material that can be used as the hole transport layer by a meniscus coating method, followed by heating and drying by a hot plate or the like, it is possible to form the hole transport layer.

The electron transport layer has a function of efficiently transporting only the electrons while blocking the holes, a function of preventing the excitons generated on the interface between itself and the photoactive layer 523 from disappearing, and so on. As the electron transport layer, a metal oxide, an organic material, or the like is usable, for instance. Examples of the metal oxide are amorphous titanium oxide obtained through hydrolysis of titanium alkoxide by using a sol gel method, and so on, for instance. As the organic material, polyethyleneimine, its derivative, or the like is used. The electron transport layer is formed by using a vacuum deposition method, a coating method, or the like, for instance.

The photoactive layer 523 is provided above the electrode 521 with the intermediate layer 522 therebetween. Further, the photoactive layer 523 has a region 523a having a first thickness and a region 523b extending from an end portion of the region 523a up to the end portion of the electrode 521 and the intermediate layer 522 and having a second thickness larger than the first thickness. The first thickness is preferably 50 nm or more and less than 200 nm, for instance. When the first thickness is less than 50 nm or over 200 nm, power conversion efficiency is likely to deteriorate. The second thickness is preferably not less than 200 nm nor more than 500 nm, for instance. When the second thickness is less than 200 nm, the electrode 521 and the electrode 525 are likely to be short-circuited in a later-described cutting step. Further, when the second thickness is over 500 nm, it is difficult for the region 523b to function as a photoelectric conversion region.

As the photoactive layer 523, a photoactive layer of a bulk hetero junction type is usable, for instance. The photoactive layer of the bulk hetero junction type has a micro-layer-separated structure of a p-type semiconductor and an n-type semiconductor which are mixed in the photoactive layer. In the photoelectric conversion element, the mixed p-type semiconductor and n-type semiconductor form a pn junction on a nano order in the photoactive layer 523, and a current can be obtained by utilizing light charge separation which occurs on a joint surface due to entering light. At least one of the p-type semiconductor and the n-type semiconductor may be an organic semiconductor.

The p-type semiconductor is formed of a material having an electron donating property. As the p-type semiconductor, polythiophene and its derivative, polypyrrole and its derivative, a pyrazoline derivative, an arylamine derivative, a stilbene derivative, a triphenyldiamine derivative, oligothiophene and its derivative, polyvinyl carbazole and its derivative, polysilane and its derivative, a polysiloxane derivative having aromatic amine at a side chain or a main chain, polyaniline and its derivative, a phthalocyanine derivative, porphyrin and its derivative, polyphenylene vinylene and its derivative, polythienylene vinylene and its derivative, and the like are usable, for instance. Further, a copolymer of any of these may be used, and for example, a thiophene-fluorene copolymer, a phenylene ethynylene-phenylene vinylene copolymer, or the like may be used.

As the p-type semiconductor, polythiophene being a conductive polymer having a π-conjugation and its derivative are usable. Polythiophene and its derivative can have excellent stereoregularity and are relative high in solubility in a solvent. Polythiophene and its derivative are not particularly limited, provided that they are each a compound having a thiophene framework.

Specific examples of polythiophene and its derivative are: polyalkylthiophene such as poly3-methylthiophene, poly3-butylthiophene, poly3-hexylthiophene, poly3-octylthiophene, poly3-decylthiophene, and poly3-dodecylthiophene; polyarylthiophene such as poly3-phenylthiophene and poly3-(p-alkylphenylthiophene); polyalkylisothionaphthene such as poly3-butylisothionaphthene, poly3-hexylisothionaphthene, poly3-octylisothionaphthene, and poly3-decylisothionaphthene; polyethylenedioxythiophene; and so on.

Further, carbazole, or a derivative such as PCDTBT (poly[N-9''-hepta-decanyl-2,7-carbazole-alt-5,5-(4', 7'-di-2-thienyl-2',1',3'-benzothiadiazole)] being a copolymer of benzothiadiazole and thiophene may be used. Using the aforesaid derivatives can enhance power conversion efficiency. Further, PTB7 ([poly{4,8-bis[(2-ethylhexyl)oxy]benzo[1,2-b:4,5-b']dithiophene-2,6-diyl-1t-alt-3-fluoro-2-[(2-ethylhexyl)carbonyl)]thieno[3,4-b]thiophene-4,6-diyl}] may be used.

A film of any of these conductive polymers is formed by applying a dispersion liquid in which the conductive polymer is dispersed in a solvent. Therefore, by a coating method or the like, it is possible to manufacture a photoelectric conversion element that costs low and has a large area, by using an inexpensive facility.

The n-type semiconductor is formed of a material having an electron accepting property. As the n-type semiconductor, fullerene and its derivative are suitably used, for instance. The fullerene derivative is not particularly limited, provided that it has a fullerene framework. Examples thereof are derivatives whose basic frameworks are C60, C70, C76, C78, C84, and the like. The fullerene derivative may be one whose carbon atoms in the fullerene framework are modified by arbitrary functional groups, and these functional groups may be bonded to form a circle. The fullerene derivative also includes a fullerene-bonded polymer. A fullerene derivative that has a functional group high in affinity to a solvent and has high solubility in the solvent is preferable.

Examples of the functional group in the fullerene derivative are: a hydrogen atom; a hydroxyl group; a halogen atom such as a fluorine atom and a chlorine atom; an alkyl group such as a methyl group and an ethyl group; an alkenyl group such as a vinyl group; a cyano group; an alkoxy group such as a methoxy group and an ethoxy group; an aromatic hydrocarbon group such as a phenyl group and a naphthyl group; an aromatic heterocyclic group such as a thienyl group and a pyridyl group; and so on. Specific examples of the fullerene derivative are fullerene hydride such as C60H36 and C70H36, oxidized fullerene of $C_{60}$ and $C_{70}$, a fullerene metal complex, and the like. Among the aforesaid ones, as the fullerene derivative, 60PCBM ([6,6]-phenylC61butyric acid methylester) or 70PCBM ([6,6]phenyl-C71butyric acid methylester) is preferably used.

When non-modified fullerene is used, C70 is preferably used. Fullerene C70 is high in generation efficiency of a photo carrier and thus is suitable as an organic photovoltaics.

A mixture ratio of the n-type semiconductor and the p-type semiconductor (n:p) in the photoactive layer 523 is preferably about 1:1 in a case where the p-type semiconductor is P3HT series. Further, in a case where the p-type semiconductor is a PCDTBT series, the ratio is preferably 4:1.

In order to apply the organic semiconductor, it is dispersed in a solvent to prepare a dispersion liquid, for instance. Examples of the solvent are: unsaturated hydrocarbon-based solvents such as toluene, xylene, tetralin, decalin, mesitylene, n-butylbenzene, sec-butylbenzene, and tert-butylbenzene; aromatic hydrocarbon halide-based solvents such as chlorobenzene, dichlorobenzene, and trichlorobenzene; saturated hydrocarbon halide-based solvents such as carbon tetrachloride, chloroform, dichloromethane, dichloroethane, chlorobutane, bromobutane, chloropentane, chlorohexane, bromohexane, and chlorocyclohexane; and esters such as tetrahydrofuran and tetrahydropyran. A halogen-based aromatic solvent is especially preferable. These solvents may be used by themselves or used in combination.

Examples of a method of forming the film by applying the organic semiconductor are a spin coat method, a dip coating method, a casting method, a bar coating method, a wire bar coating method, a spray method, a screen printing method, a gravure printing method, a flexographic printing method, an offset printing method, a gravure offset printing method, a dispenser method, a nozzle coating method, a capillary coating method, an ink-jet method, and so on, and these coating methods may be used by themselves or in combination.

As a film forming method of the photoactive layer 523, a meniscus coating method is usable. The meniscus coating method forms meniscus columns by supplying a coating material between a coating head having a plurality of applicator regions and a coating surface of a coating target. Thereafter, the coating material is applied on the coating surface while the coating head and the coating target are moved relatively to each other. The meniscus coating method is capable of forming the photoactive layers 523 in the plural cells 52 at one time.

The intermediate layer 524 is provided on the photoactive layer 523 and extends up to an end portion of the photoactive layer 523. The intermediate layer 524 is laid above the intermediate layer 522 with the photoactive layer 523 therebetween. The intermediate layer 524 has the other one of the functions as the electron transport layer and the hole transport layer, and so on.

The electrode 525 is provided above the region 523a and the region 523b of the photoactive layer 523 with the intermediate layer 524 therebetween. The plural electrodes 525 are preferably separated from one another. The electrode 525 is electrically connected to the electrode 521 of the adjacent cell 52 on a subsequent stage.

As the electrode 525, metal, a metal oxide, a conductive polymer, or the like is usable, for instance. In a case where light enters via the electrode 525, the electrode 525 has a light transmitting property.

As the electrode 525, metal such as platinum, gold, silver, copper, nickel, cobalt, iron, manganese, tungsten, titanium, zirconium, tin, zinc, aluminum, indium, chromium, lithium, sodium, potassium, rubidium, cesium, calcium, magnesium, barium, samarium, or terbium, an alloy containing any of these, a conductive metal oxide such as an indium-zinc oxide (IZO), a conductive polymer such as PEDOT/PSS, or a carbon material such as graphene is used, for example. A material in which a nano conductive material such as a silver nanowire, a gold nanowire, or a carbon nanotube is mixed in any of the aforesaid materials is also usable. The electrode 525 is formed by forming a film of any of the aforesaid materials by a vacuum deposition method, a sputtering method, an ion plating method, a plating method, or a coating method, for instance. Hitherto, the structure example of the cell 52 is described. Incidentally, the structure of the cell 52 may be a structure in which a charge extraction direction is opposite the direction in the above structure.

As the sealing part 53, a glass frit, a thermosetting resin, a thermoplastic resin, or a light curing resin is usable, for instance. Incidentally, after the later-described cutting step, the sealing part 53 may be provided so as to be in contact with side surfaces of the substrate 51 to seal the intermediate layers 522, the photoactive layers 524, and the intermediate layers 524.

As described above, the photoelectric conversion element of this embodiment has the photoactive layer having the first region having the first thickness and the second region extending from the first region up to the end portion of the element formation surface of the substrate and having the thickness larger than the first thickness. Consequently, since no short circuit occurs between the electrode 521 and the electrode 525 during the later-described cutting step and a region up to the end portion of the substrate can be used as a photoelectric conversion region, it is possible to enhance power conversion efficiency and manufacturing yields.

Next, an example of a manufacturing method of the photoelectric conversion element of this embodiment will be descried with reference to FIG. 4A to FIG. 7B. FIG. 4A to FIG. 7A are schematic explanatory plane views of the example of the manufacturing method of the photoelectric conversion element. FIG. 4B to FIG. 7B are schematic explanatory sectional views of the example of the manufacturing method of the photoelectric conversion element. Here, an example where a plurality of photoelectric conversion elements are manufactured in the same step will be described.

Figure 4A:
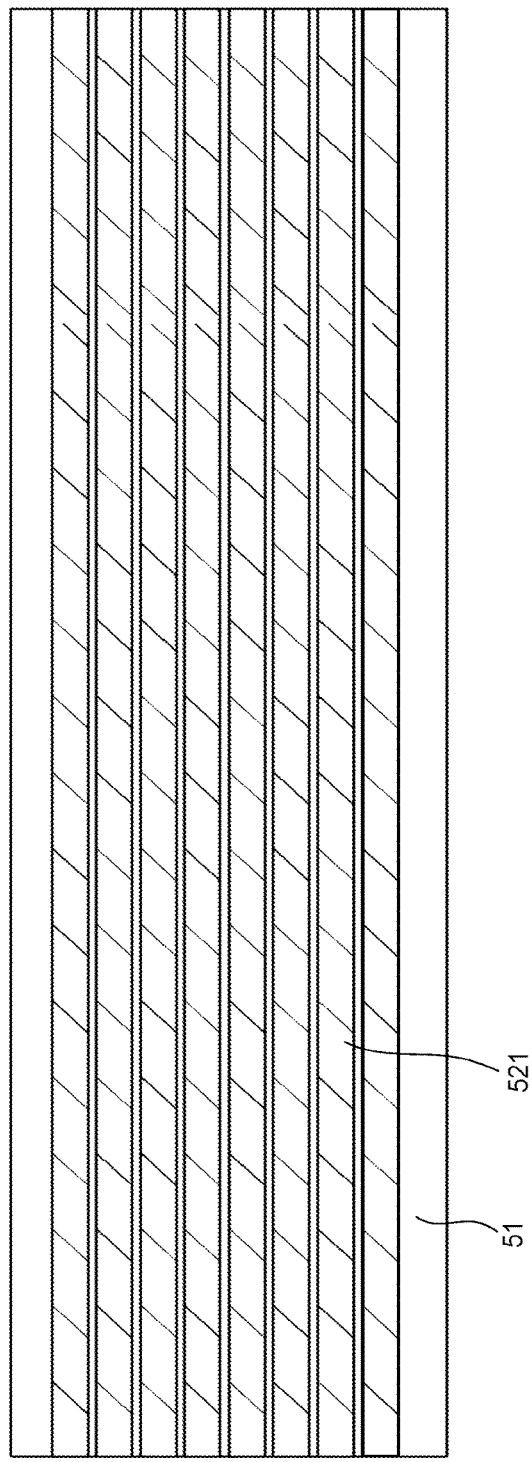
FIG. 4A and FIG. 4B are schematic explanatory views of an example of a manufacturing method of the photoelectric conversion element.
Figure 4B:
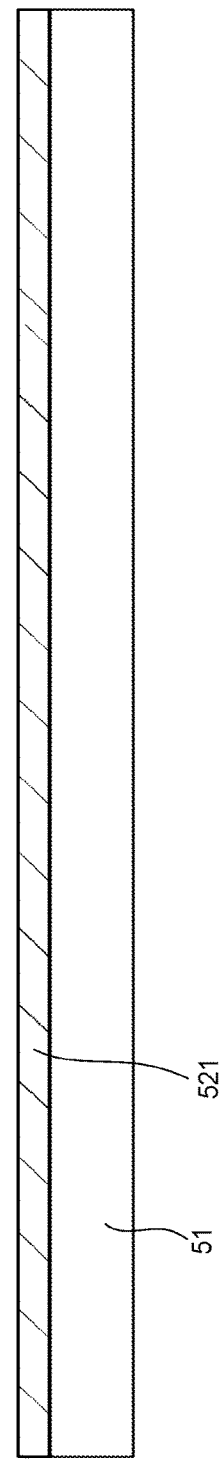

First, as illustrated in FIG. 4A and FIG. 4B, the electrodes 521 are formed on the element formation surface of the substrate 51 so as to extend in one direction of the element formation surface. For example, it is possible to form the electrodes 521 by forming the films of any of the aforesaid materials by a vacuum deposition method, a sputtering method an ion plating method, a plating method, a coating method, or the like, for instance.

Figure 5A:
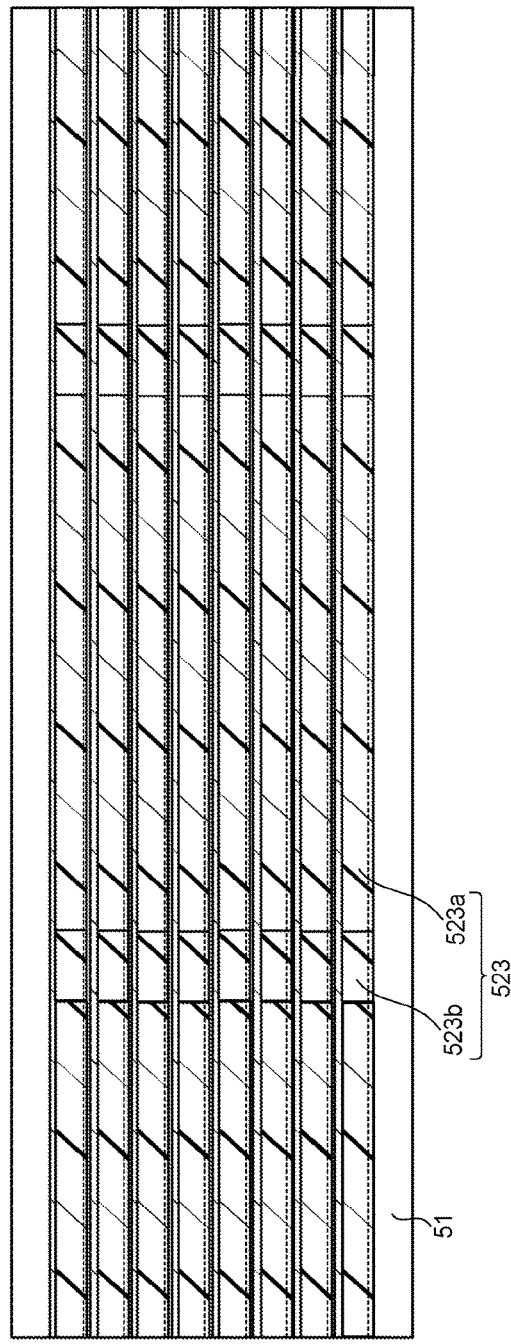
FIG. 5A and FIG. 5B are schematic explanatory views of the example of the manufacturing method of the photoelectric conversion element.
Figure 5B:
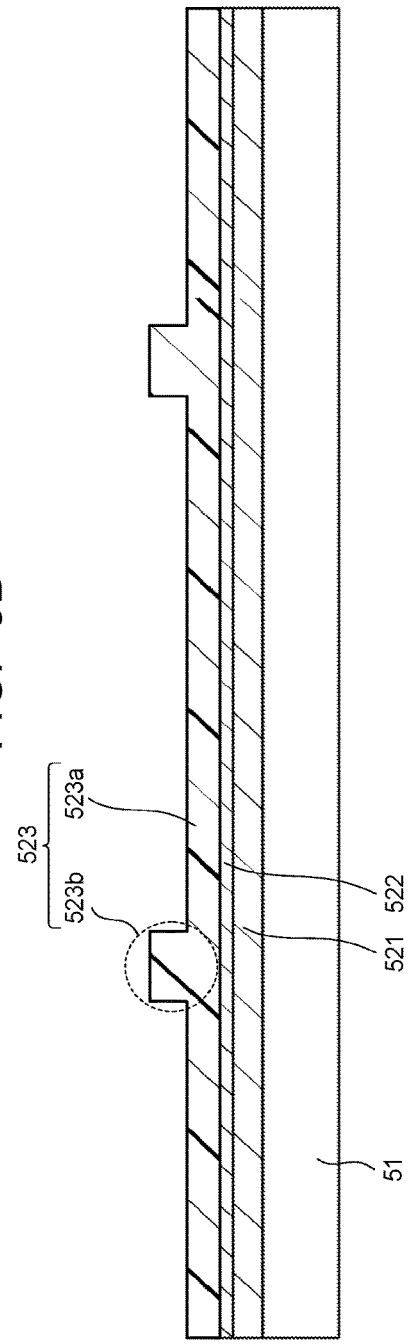

Next, as illustrated in FIG. 5A and FIG. 5B, the intermediate layers 522 are formed on the electrodes 521 by a coating method, a vapor deposition method, or the like. Further, the photoactive layers 523 each having the region 523a and the region 523b are formed above the electrodes 521 with the intermediate layers 522 therebetween.

A method of forming the regions 523a and the regions 523b is not particularly limited. For example, by changing a coating speed or the like of a coating material by using a meniscus coating method, it is possible to make the regions 523a and the regions 523b different in thickness.

Next, as illustrated in FIG. 6A and FIG. 6B, the intermediate layers 524 are formed on the photoactive layers 523 by using a coating method, a vapor deposition method, or the like. Further, the electrodes 525 are formed above the regions 523a and the regions 523b of the photoactive layers 523 with the intermediate layers 524 therebetween. For example, it is possible to form the electrodes 525 by forming films of any of the aforesaid materials by a vacuum deposition method, a sputtering method, an ion plating method, a plating method, a coating method, or the like.

Figure 7A:
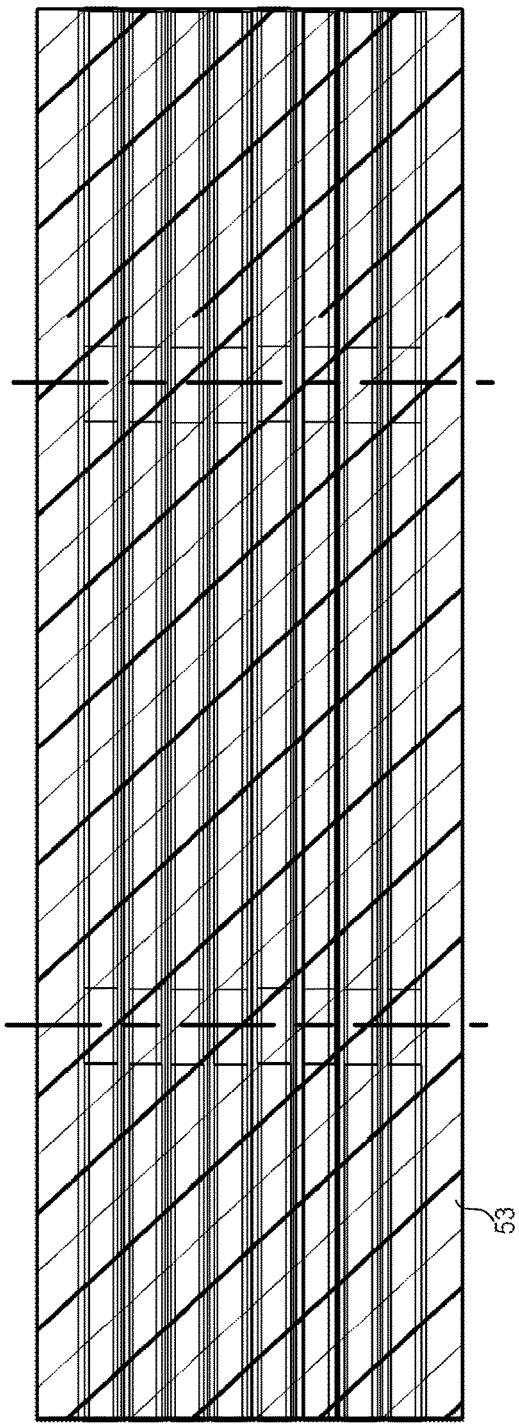
FIG. 7A and FIG. 7B are schematic explanatory views of the example of the manufacturing method of the photoelectric conversion element.
Figure 7B:
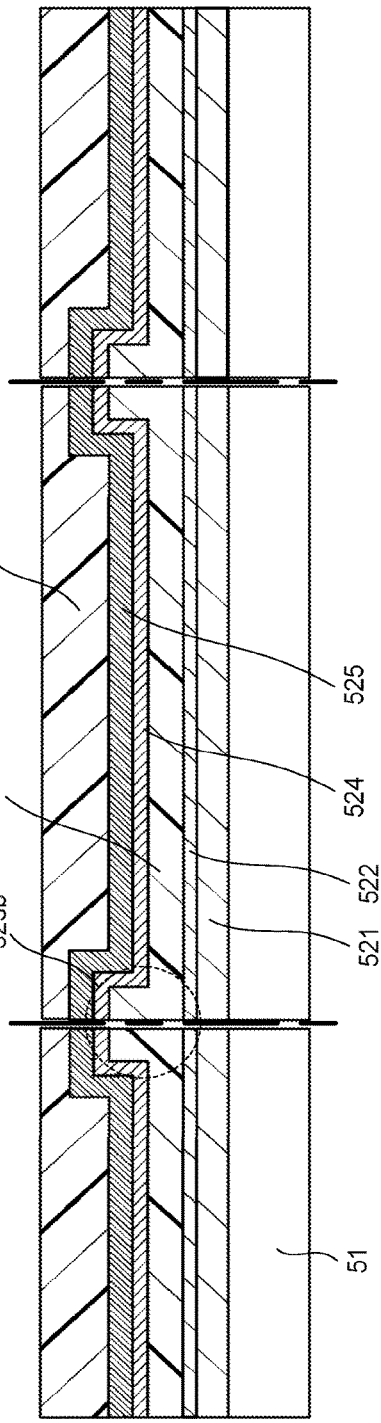

Next, as illustrated in FIG. 7A and FIG. 7B, the sealing part 53 sealing the cells 52 is formed, and thereafter the substrate 51, the electrodes 521, the intermediate layers 522, the regions 523b of the photoactive layers 523, the intermediate layers 524, the electrodes 525, and the sealing part 53 are cut along a direction intersecting with the one direction of the element formation surface. For example, it is possible to execute the above cutting step by a mechanical method using a cutting tool or the like for the cutting, a heating method using laser or the like for the cutting, or the like. Consequently, the plural photoelectric conversion elements can be obtained from the single substrate. Incidentally, the cutting may be performed after the sealing part 53 is formed, and thereafter the sealing part 53 may be formed.

As described above, in the manufacturing method of the photoelectric conversion element of this embodiment, the photoactive layers each having the first region having the first thickness and the second region extending from the first region up to the end portion of the substrate and having the thickness larger than the first thickness are formed, and thereafter, the cutting is performed at the second regions.

For example, in a case of a manufacturing method of photoelectric conversion elements having photoactive layers 523 having a uniform thickness, the photoactive layers 523 are crushed down at the time of the cutting by the mechanical method, so that electrodes 525 and electrodes 521 are sometimes short-circuited. Especially the photoactive layers 523 using a polymer material are easily crushed down. Further, in the cutting by the mechanical method or the heating method, particles of the electrodes 521 sometimes adhere on cut surfaces. In this case, the electrodes 525 and the electrodes 521 are sometimes short-circuited due to the particles.

On the other hand, in the manufacturing method of the photoelectric conversion element of this embodiment, by performing the cutting at the second regions being relatively thick regions, it is possible to suppress the short circuit between the electrodes 521 and the electrodes 525. Therefore, since the region up to the end portion (cut portion) of the substrate can be used as the photoelectric conversion region, it is possible to improve power conversion efficiency, enabling the high-yield manufacture of the photoelectric conversion elements having high power conversion efficiency.

Figure 8:
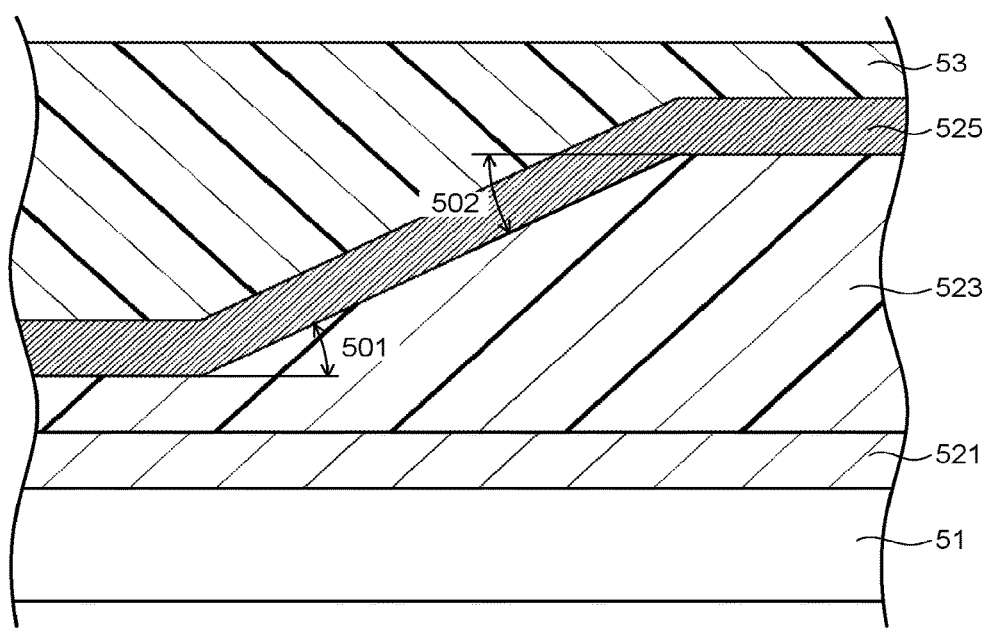
FIG. 8 is a schematic view illustrating another structure example of the photoelectric conversion element.

Incidentally, side surfaces of the regions 523b of the photoactive layers 523 each may have a taper angle as illustrated in FIG. 8. In FIG. 8, the intermediate layer 522 and the intermediate layer 524 are omitted for convenience' sake. For example, an angle 501 made by a lower surface and the side surface of the region 523b is preferably 60 degrees or less. Further, an angle 502 made by an upper surface and the side surface of the region 523b is preferably 60 degrees or less. When the angle 501 and the angle 502 are over 60 degrees, what is called benching, that is, a reduction of a thickness of the electrode 525 at its corner portion, occurs, which increases an electric resistance value of the electrode 525.

Figure 9:
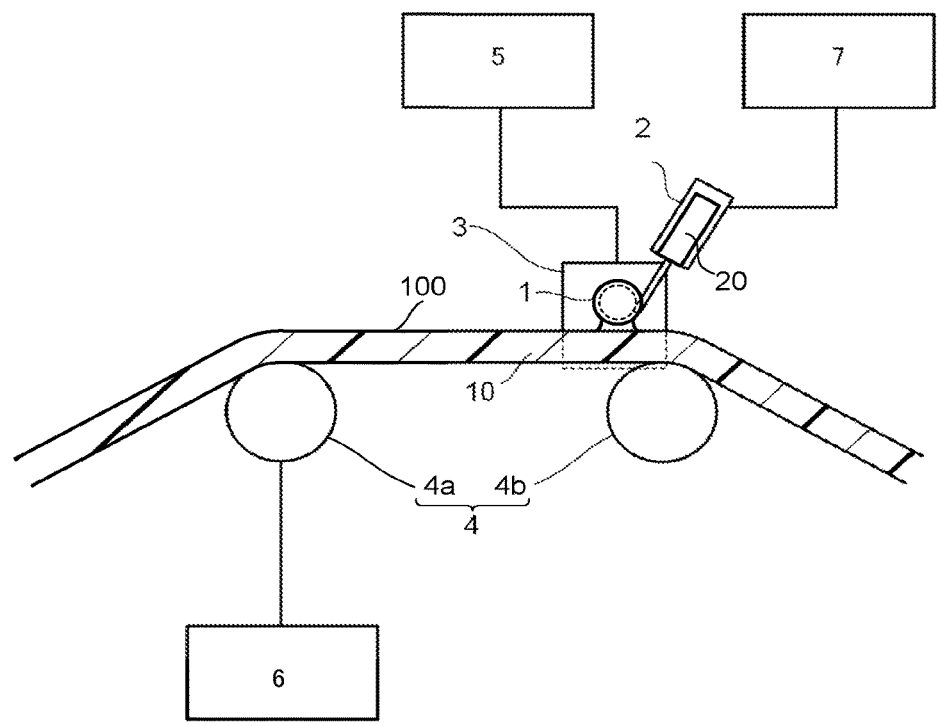
FIG. 9 is a schematic view illustrating a structure example of a coating apparatus.

Here, a coating apparatus and a coating method applicable to the formation of the photoactive layers 523 will be described. FIG. 9 is a schematic view illustrating a structure example of the coating apparatus. The coating apparatus illustrated in FIG. 9 has a coating head 1, supply mechanisms 2, a moving mechanism 3 which moves the coating head 1, a moving mechanism 4 which moves a coating target 10, a control mechanism 5 which controls the moving mechanism 3, a control mechanism 6 which controls the moving mechanism 4, and a control mechanism 7 which controls the supply mechanisms 2.

Figure 10:
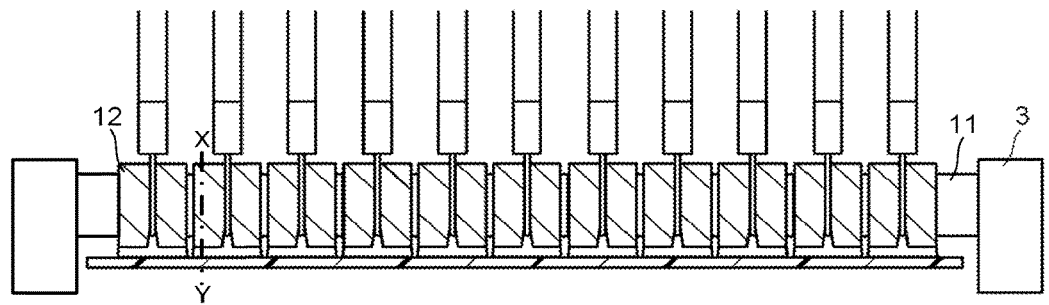
FIG. 10 is a schematic view illustrating a structure example of a coating head.

The coating head 1 has a function of applying a coating material on a coating surface 100 of the coating target 10 such as a substrate. Here, a structure example of the coating head 1 will be described with reference to FIG. 10. FIG. 10 is a schematic front view illustrating the structure example of the coating head 1. Incidentally, the coating head 1 does not necessarily have to include a mechanism for rotating it.

As illustrated in FIG. 10, the coating head 1 includes a main shaft 11, a plurality of applicator regions 12 provided along a length direction of the main shaft 11 so as to be apart from one another. An end portion of the main shaft 11 is connected to the moving mechanism 3. The coating head 1 can be moved by the mechanism 3 moving the main shaft 11 along one direction of the coating surface 100.

Figure 11:
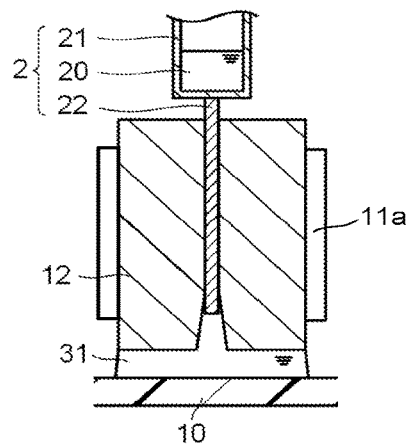
FIG. 11 is a schematic view illustrating a structure example of an applicator region.
Figure 12:
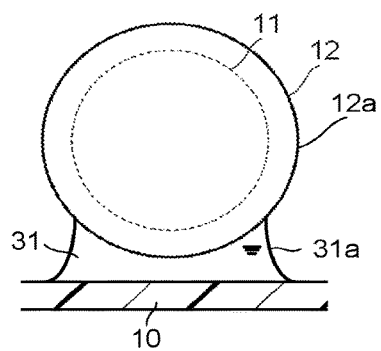
FIG. 12 is a schematic view illustrating the structure example of the applicator region.

Further, a structure example of the applicator regions 12 will be described with reference to FIG. 11 and FIG. 12. FIG. 11 is an enlarged view of the single applicator region 12, and FIG. 12 is a schematic sectional view of the applicator region 12 taken along X-Y line in FIG. 10. The applicator region 12 has a columnar outer peripheral surface 12a provided along a side surface of the main shaft 11. For example, a coating material 20 is supplied to the outer peripheral surface 12a via a needle 22 of a syringe pump 21 storing the coating material 20 having the material of the photoactive layer 523. At this time, the coating material 20 drops down the outer peripheral surface 12a to be supplied between the coating head 1 and the coating surface 100. Further, the coating head 1 has groove portions 11a between the plural applicator regions 12.

Between the applicator region 12 and the coating target 10, a meniscus column 31 is formed. The meniscus column 31 is a columnar body having an arc-shaped curved surface 31a. The shape of the meniscus column 31 changes according to, for example, an interval between the applicator region 12 and the coating surface 100 of the coating target 10, properties (viscosity, surface tension, and so on) of the coating material 20, a supply amount of the coating material 20, and so on. In the coating head 1 illustrated in FIG. 10 to FIG. 12, it is possible for the applicator regions 12 to form a plurality of strip-shaped coating patterns respectively. Hitherto, the coating head 1 is described.

The supply mechanism 2 stores the coating material 20. The supply mechanism 2 has a function of supplying the coating material 20 between the coating head 1 and the coating surface 100 of the coating target 10. As the supply mechanism 2, a syringe pump or the like capable of accurately jetting a minute amount of the material is usable, for instance. Further, the supply mechanism 2 is not limited to this, and for example, a method suitable for jetting a minute amount of the material may be used.

The moving mechanism 3 has a function of moving the coating head 1 along the one direction of the coating surface 100. The moving mechanism 4 has a function of moving the coating target 10 in one direction of the coating surface 100. The moving mechanism 4 has a roller 4a and a roller 4b supporting the coating target 10, for instance. The coating target 10 is disposed on the roller 4a and the roller 4b, and the roller 4a and the roller 4b are rotated in the same direction, whereby the coating target 10 can be moved. Note that this is not restrictive, and the moving mechanism 4 may be constituted by using a stage supporting the coating target 10 and capable of moving up and down and left and right. Note that the coating apparatus only needs to include at least one of the moving mechanism 3 and the moving mechanism 4.

The control mechanism 5 has a function of controlling at least one of a moving speed and a moving direction of the coating head 1 of the coating material according to the start and stop of the supply of the coating material to a gap between the coating head 1 and the coating target 10. The control mechanism 6 has a function of controlling at least one of a moving speed and a moving direction of the coating target 10 according to the start and stop of the supply of the coating material to the gap between the coating head 1 and the coating target 10. Incidentally, in a case where the moving mechanism 3 is not provided, the control mechanism 5 need not be provided, and in a case where the moving mechanism 4 is not provided, the control mechanism 6 need not be provided. Further, one control mechanism may serve as the control mechanism 5 and the control mechanism 6.

The control mechanism 7 has a function of controlling the start and stop of the supply of the coating material to the gap between the coating head 1 and the coating target 10 and a function of controlling a supply speed of the coating material. Note that one control mechanism may serve as the control mechanism 7 and the control mechanism 6.

The control mechanism 5 or the control mechanism 7 is constituted by using hardware using a processor or the like, for instance. Incidentally, each operation may be stored as an operating program in a computer-readable recording medium such as a memory, and each operation may be executed by the hardware reading the operating program in the recording medium as required.

Next, a coating method using the above-described coating apparatus will be described. Here, the description will be given, assuming that the coating target 10 is the substrate 51 having the electrodes 521 and the intermediate layers 522, and the coating material is the material of the photoactive layers. In an example of the coating method, the coating head 1 and the coating surface 100 of the coating target 10 are laid on one another. At this time, the interval between the coating head 1 and the coating surface 100 is appropriately set within a range of not less than 50 micrometers nor more than 1000 micrometers, for instance. Further, the coating material 20 is supplied between the coating head 1 and the coating surface 100 from the supply mechanisms 2, whereby the meniscus columns are formed.

Next, at least one of the coating head 1 and the coating target 10 is moved along one direction of the coating surface 100, whereby a step of applying the coating material 20 on the coating surface 100 from the first regions up to the second regions is performed. Incidentally, when the coating head 1 is moved, the supply mechanisms 2 are also moved at the same time.

After the coating material 20 is applied up to the second regions, a step of additionally supplying the coating material 20 between the coating head 1 and the coating surface 100 while at least one of the coating head 1 and the coating target 10 is stopped, or additionally supplying the coating material 20 between the coating head 1 and the coating surface 100 while the coating head 1 or the coating target 10 is moved at a speed lower than a moving speed thereof in the aforesaid step of applying the coating material along the one direction of the coating surface 100 is performed above the second regions. Here, the movement of the coating target 10 by the moving mechanism 4 is stopped by the control mechanism 6.

A timing at which the coating material 20 is additionally supplied is controlled by the control mechanism 7, for instance. For example, the coating material 20 may be additionally supplied when a length of the coating pattern in the coating direction reaches a reference value or more. Alternatively, the coating material 20 may be additionally supplied when a width of the meniscus column in the coating direction becomes less than a reference value. When the width of the meniscus column becomes small, a width of the coating pattern is likely to change. A state of the coating pattern and the width of the meniscus column can be measured by using an image pickup device or the like, for instance.

After the coating material 20 is additionally supplied, the coating operation is resumed. The coating head 1 or the coating target 10 is moved along the first direction of the coating surface 100 at a speed higher than the moving speed of the coating head 1 or the coating target 10 in the aforesaid step of additionally supplying the coating material, whereby a step of applying the coating material 20 on the coating surface 10 from the second regions up to third regions is performed. The moving speed of the coating head 1 or the coating target 10 in this step may be set equal to the moving speed of the coating head 1 or the coating target 10 in the aforesaid step of applying the coating material.

Incidentally, when the application of the coating material 20 is further continued, the aforesaid step of additionally supplying the coating material 20 and the subsequent step of resuming the coating are repeated. Consequently, it is possible to form the photoactive layers each having the region 523a and the region 523b thicker than the region 523a. A length of the region 523a in the one direction of the element formation surface of the substrate 51 is preferably not less than 50 mm nor more than 100 mm, for instance. When the length of the region 523a is over 100 mm, it is difficult to control the coating pattern, depending on a relation between a supply amount and a consumption amount of the coating solution, and so on. A length of the region 523b in the one direction of the element formation surface of the substrate 51 can be shorter than that of the region 523a, and for example, not less than 5 mm nor more than 15 mm. When the length of the region 523a is, for example, 50 mm or less, the film thickness is too large and there is no difference from the length of the region 523b inferior in power conversion efficiency, resulting in deterioration of power conversion efficiency as the whole photoelectric conversion element.

Besides, as the coating speed (the moving speed of the coating head 1 and the coating target 10) is increased, the film thickness becomes larger. Further, as a diameter of the meniscus column is increased in the coating direction during the coating, the film thickness becomes larger. As the supply amount of the coating material is increased, the film thickness becomes larger. As the viscosity of the coating material is increased, the film thickness becomes larger.

As for the viscosity, by adjusting a kind and a solid content concentration of the solvent, temperature of the coating material, and so on, it is possible to adjust the film thickness. Further, as the surface tension of the coating material is increased, the film thickness becomes larger. It is possible to adjust the surface tension by the kind and the solid content concentration of the solvent, the temperature of the coating material, and so on.

As the solid content concentration of the coating material is increased, the film thickness becomes larger. Increasing a drying speed of the solvent of the meniscus column of the coating material increases the film thickness. For example, when the coating head and the coating target are stood still in the state where the meniscus columns of the coating solution are formed between the coating head and the coating target, the adhesion of the solid content to the coating target progresses in accordance with the drying of the solvent, so that the thick film is formed. Further, for example, increasing the temperature can shorten the time for forming the thick film.

In another example of the coating method, the coating head 1 and the coating surface 100 of the coating target 10 are laid on each other and the coating material 20 is supplied between the coating head 1 and the coating surface 100 from the supply mechanisms 2, as in the above-described coating method. Next, the coating target is moved along a first direction of the coating surface 100 and the coating head 1 is moved in a second direction opposite the first direction of the coating surface 100, whereby a step of applying the coating material 20 on the coating surface 100 from the first regions up to the second regions is performed.

After the coating material 20 is applied on the coating target up to the second regions, a step of additionally supplying the coating material 20 between the coating head 1 and the coating surface 100 while moving the coating head 1 and the coating target 10 in the first direction is performed above the second regions. A method of controlling a timing at which the coating material 20 is additionally supplied is the same as the above-described method. At this time, moving speeds of the coating head 1 and the coating target 10 are preferably equal.

After the coating material 20 is additionally supplied, the coating operation is resumed. The coating target 10 is moved in the first direction and the coating head 1 is moved in the second direction, whereby a step of applying the coating material 20 on the coating surface 100 from the first regions up to the second regions is performed.

Incidentally, when the application of the coating material 20 is further continued, the step of additionally supplying the coating material 20 and the step of thereafter resuming the coating are repeated in the same manner as in the above-described example of the coating method. Consequently, it is possible to form the photoactive layers 523 each having the region 523a and the region 523b.

In the above-described other example of the coating method, by moving not only the coating target but also the coating head, it is possible to move the coating target at a constant speed, which felicitates the control of the movement of the coating target. Incidentally, the interval between the coating head 1 and the coating surface 100 of the coating target 10 may be changed by the moving mechanism 4. Further, as for the taper angle, by, for example, adjusting the leveling time and the drying and solidification time of the coating material after the coating material transfers from the meniscus columns to the coating surface 100, it is possible to adjust the taper angle of the regions 523b. For example, by reducing the drying speed, it is possible to make the taper angle small. It should be noted that the coating apparatus and the coating method of the embodiment are applicable not only to a photovoltaics but also to techniques in general in which the multiple strip-shaped pattern coating illustrated in FIG. 1 is useful, such as, for example, lighting, a display, and so on of an organic EL (Electro Luminescence: EL) type. Further, they are applicable to techniques in general in which a single strip-shaped pattern coating instead of the multiple strip-shaped pattern coating is useful.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The inventions described in the accompanying claims and their equivalents are intended to cover such forms or modifications as would fall within the scope and spirit of the inventions.

EXAMPLES

Example 1

A substrate on which ITO films with a 150 nm thickness were formed as first electrodes corresponding to the electrodes 521 on a substrate of a PEN (polyethylene naphthalate) film with a 200 micrometer thickness was prepared. Next, films of PEIE (polyethyleneimine, 80% ethoxylated) with an about 1 nm thickness were formed as first intermediate layers corresponding to the intermediate layers 522.

Next, by using a coating head made of SUS303, a material of photoactive layers corresponding to the photoactive layers 523 was applied on the first intermediate layers. As the material of the photoactive layers, used was a coating solution in which 8 mg PTB7 ([poly{4,8-bis[(2-ethylhexyl)oxy]benzo[1,2-b:4,5-b']dithiophene-2,6-diyl-1t-alt-3-fluoro-2-[(2-ethylhexyl)carbonyl]thieno[3,4-b]thiophene-4,6-diyl}]) and 12 mg PC70BM (/[6,6]phenylC71butyric acid methylester) were dispersed in 1 ml monochlorobenzene.

As a coating head, a coating head having 23 applicator regions was used. A width of each of the applicator regions is 12.0 mm. Further, a width of each groove portion between the applicator regions is 1.2 mm, and its width is 0.5 mm. An interval between the coating head and the substrate was set to 0.88 mm.

A syringe pump was disposed as a supply mechanism for each of the applicator regions, and 45 microliters of the material of the photoactive layers was jetted per applicator region, whereby 23 continuous meniscus columns were formed. At this time, when a width of each of the meniscus columns (also called a nip length) in a coating direction was measured by using a camera captured image, the result was about 5 mm.

Next, the substrate was moved at a 10 mm/s speed to start the application of the material of the photoactive layers. At an instant when the material of the photoactive layers was thereafter applied up to a 100 mm length, the width of the meniscus columns was reduced to about 4.3 mm. At this instant, the movement of the substrate was once stopped, and 6.4 microliters of the material of the photoactive layers was additionally supplied to each of the applicator regions. Consequently, the width of the meniscus columns in the coating direction returned to the original width of about 5 mm.

Next, the movement of the substrate was resumed at a 10 mm/s speed, and the material of the photoactive layers was applied. The time from the stop to the resumption of the movement of the substrate was set to 20 seconds. Thereafter, the additional supply operation of the material of the photoactive layers and the movement operation of the substrate were repeated to apply the material of the photoactive layers, whereby the photoactive layers were formed. In each of the photoactive layers, in a first region with an about 90 mm length corresponding to the region 523*a*, its width was about 12.5 mm and its film thickness was about 100 nm, and a coating pattern was uniform both in the width and the film thickness. In a second region with an about 10 mm length corresponding to the region 523*b*, its film thickness was about 200 nm. This is because the coating head and the substrate were stood still for five seconds in the state where the meniscus columns of the material of the photoactive layers were formed between the coating head and the substrate and accordingly the adhesion of the solid content to the substrate progresses in accordance with the drying of a solvent, and the thick films were formed.

Thereafter, films of molybdenum trioxide with a 5 nm thickness were formed as second intermediate layers corresponding to the intermediate layers 524 on the photoactive layers by a vapor deposition method, and silver films with a 150 nm thickness were formed as second electrodes corresponding to the electrodes 525, on the second intermediate layers by a vapor deposition method. Further, after a sealing layer was formed, it was laid over the second regions, and along a direction intersecting with the coating direction, the substrate, the first electrodes, the first intermediate layers, the second regions of the photoactive layers, the second intermediate layers, the second electrodes, and the sealing layer were cut, whereby organic photovoltaic modules were fabricated. When power conversion efficiency of the five fabricated organic photovoltaic module was measured by using a solar simulator with AM 1.5 G and 1000 W/m$^2$, it was 6.5% to 7.0%.

Example 2

Organic photovoltaic modules were fabricated by the same method and of the same materials as those of Example 1 except in a formation method of photoactive layers. The photoactive layers were formed as follows.

First, a coating head was disposed above a substrate at a 0.88 mm gap. Next, a syringe pump was disposed as a supply mechanism for each applicator region, and a 45 microliter material of the photoactive layers was jetted per applicator region, whereby 23 continuous meniscus columns were formed. At this time, when a width of each of the meniscus columns (also called a nip length) in a coating direction was measured by using a camera collected image, the result was about 5 mm.

Next, the substrate was moved in a first direction at a 5 mm/s speed and at the same time the coating head was moved at a 5 mm/s speed in a second direction opposite the first direction, whereby a coating material was applied. At this time, a relative speed of the substrate and a coating mechanism was 10 mm/s which is equal to that in Example 1, and a thickness of the coating material was about 100 nm which is also equal to that in Example 1.

At an instant when relative positions of the substrate and the coating head were apart from each other by 100 mm (an absolute position of the substrate was +50 mm and an absolute position of the coating head was −50 mm), the width of the meniscus columns decreased to about 4.3 mm. At this instant, the coating head was moved at a 5 mm/s speed in the same direction as that of the substrate. At this time, a relative speed of the substrate and the coating head becomes 0 mm/s. At the same time, 6.4 microliters of the material of the photoactive layers was additionally supplied to each of the applicator regions. At this time, the width of the meniscus columns in the coating direction returned to the original width of about 5 mm.

At an instant when the absolute position of the coating head returned to ±0 mm equal to that at the start of the coating, the coating head was moved at a 5 mm/s speed in the direction opposite the substrate, whereby the coating material was applied again The time from the instant when the relative speed of the coating mechanism and the substrate became 0 mm/s up to the instant when the coating at the 10 mm/s relative speed was resumed was 20 seconds. The above-described operations were repeated to form the photoactive layers. In each of the photoactive layers, a width of a first region with an about 90 mm length was about 12.5 mm and its thickness was about 100 nm, and a coating pattern was uniform both in the width and the film thickness. In a second region with an about 10 mm length, its film thickness was about 200 nm.

Further, after a sealing layer was formed, it was laid on the second regions, and along a direction intersecting with the coating direction, the substrate, first electrodes, first intermediate layers, the second regions of the photoactive layers, second intermediate layers, second electrodes, and the sealing layer were cut, whereby the organic photovoltaic modules were fabricated. When power conversion efficiency of the five fabricated organic photovoltaic module was measured by using a solar simulator with AM 1.5 G and 1000 W/m$^2$, it was 6.7% to 7.0%.

Example 3

Organic photovoltaic modules were fabricated in the same manner as in Example 1 except that the time from the stop of the movement of a substrate up to the resumption was increased to 48 seconds, and the substrate movement was stopped, and an amount of a material of photoactive layers additionally supplied was increased to 9.6 microliters per applicator region.

A width and a film thickness of each first region with an about 90 mm length were equal to those in Example 1, but a film thickness of each second region with an about 10 mm length was about 480 nm. When power conversion efficiency of the five fabricated organic photovoltaic module was measured by using a solar simulator with AM 1.5 G and 1000 W/m², it was 6.2% to 6.7%.

Example 4

Organic photovoltaic modules were fabricated by the same method and of the same materials as those in Example 1 except in a method of forming photoactive layers. The photoactive layers were formed as follows.

First, a coating head was disposed above a substrate at a 0.88 mm gap. Next, a syringe pump was disposed as a supply mechanism for each applicator region, and a 45 microliter coating material of the photoactive layers was jetted per applicator region, whereby 23 continuous meniscus columns were formed. At this time, when a width of each of the meniscus columns (also called a nip length) in a coating direction was measured by using a camera collected image, the result was about 5 mm.

Next, the substrate was moved at a 10 mm/s speed and the application of the material of the photoactive layers was started. Thereafter, at an instant when a length of the applied material of the photoactive layers reached 100 mm, the movement of the substrate was once stopped, and 6.4 microliters of the material of the photoactive layers was additionally supplied to each of the applicator regions. The time taken for the additional supply was 0.64 seconds.

Next, by moving the substrate at a 28 mm/s speed, the material of the photoactive layers was applied along a 5 mm length, and thereafter, by moving the substrate at a 10 mm/s speed, the material of the photoactive layers was applied along a 95 mm length. Thereafter, the material of the photoactive layers was applied by repeating the additional supply operation of the material of the photoactive layers and the moving operation of the substrate, whereby the photoactive layers were formed. In each of the photoactive layers, a width of a first region with an about 85 mm length was about 12.5 mm and its thickness was about 100 nm, and a coating pattern was uniform both in the width and the film thickness. A width of a second region with an about 15 mm length was about 200 nm.

Thereafter, when power conversion efficiency of the five fabricated organic photovoltaic module was measured by using a solar simulator with AM 1.5 G and 1000 W/m², it was 6.3% to 6.8%.

Comparative Example 1

Organic photovoltaic modules were fabricated in the same manner as in Example 1 except that the time from the stop of the movement of a substrate up to the resumption was reduced to 10 seconds.

A width and a film thickness of each first region with an about 90 mm length were equal to those in Example 1, but a film thickness of each second region with an about 10 mm length was about 180 nm. When power conversion efficiency of the five fabricated organic photovoltaic module was measured by using a solar simulator with AM 1.5 G and 1000 W/m², it was 4.4% to 6.7%. That is, it is understood that a module not having a sufficient property is included and yields deteriorate. Further, when EL (electroluminescence) evaluation generally known in a field of photovoltaics was conducted, there was a cell in which EL emission intensity in a region near a cut portion was lower than that in other portions. From this, it is inferred that a second electrode and a first electrode are short-circuited.

Comparative Example 2

Organic photovoltaic modules were fabricated in the same manner as in Example 1 except that second intermediate layers and second electrodes were not provided on second regions of photoactive layers.

When power conversion efficiency of the five fabricated organic photovoltaic module was measured by using a solar simulator with AM 1.5 G and 1000 W/m², it was 6.0% to 6.4%. This is because portions where the second electrodes are not formed do not contribute to photoelectric conversion.

Comparative Example 3

Organic photovoltaic module were fabricated in the same manner as in Example 1 except that the time from the stop of the movement of a substrate up to the resumption was increased to 60 seconds, and the substrate movement was stopped, and an amount of a material of photoactive layers additionally supplied was increased to 9.6 microliters per applicator region.

A width and a film thickness of each first region with an about 90 mm length was equal to those in Example 1, but a film thickness of each second region with an about 10 mm length was about 520 nm. When power conversion efficiency of the five fabricated organic photovoltaic module was measured by using a solar simulator with AM 1.5 G and 1000 W/m², it was 5.9% to 6.4%. It is thought that this is because the thickness of the second regions is over 500 nm and the power conversion efficiency deteriorates.

As described above, the organic photovoltaic modules of the present examples have higher power conversion efficiency and higher yields as compared with the organic photovoltaic module of the comparative examples.

What is claimed is:

1. A manufacturing method of a photoelectric conversion element, comprising:
    forming a first electrode above an element formation surface of a substrate so as to make the first electrode extend along one direction of the element formation surface;
    forming, above the first electrode, a photoelectric conversion layer having a first region and two second regions, the first region and the second regions being provided above the first electrode, one of the second regions extending from a first end of the first region along a first direction, the other of the second regions extending from a second end of the first region along the first direction, and each of the second regions being thicker than the first region;
    forming a second electrode above the first and second regions; and
    cutting the substrate, the first electrode, the second region, and the second electrode along a direction intersecting with the one direction of the element formation surface,
    wherein a first side end of the substrate, a first side end of the first electrode, a side end of the one of the second regions, and a first side end of the second electrode are flush with each other along a second direction intersecting with the first direction, and
    wherein a second side end of the substrate, a second side end of the first electrode, a side end of the other of the second regions, and a second side end of the second electrode are flush with each other along the second direction.

2. The method of claim 1,
    wherein the first region thickness is 50 nm or more and less than 200 nm, and
    wherein the second region thickness is 200 nm or more and 500 nm or less.

3. The method of claim 1,
wherein a length of the first region in the one direction of the element formation surface is not less than 50 mm nor more than 100 mm, and
wherein a length of the second region in the one direction of the element formation surface is not less than 5 mm nor more than 15 mm.

4. The method of claim 1,
wherein the photoelectric conversion layer contains a polymer material.

5. The method of claim 1,
wherein an angle made by a lower surface and a side surface of the second region is 60 degrees or less, and
wherein an angle made by an upper surface and the side surface of the second region is 60 degrees or less.

6. The method of claim 1, further comprising:
forming a first intermediate layer between the first electrode and the photoelectric conversion element; and
forming a second intermediate layer between the photoelectric conversion layer and the second electrode.

7. A photoelectric conversion element comprising:
a substrate having a surface;
a first electrode provided on the surface and extending along a first direction on the surface;
a photoelectric conversion layer consisting of a first region and two second regions, the first region and the second regions being provided above the first electrode, one of the second regions extending from a first end of the first region along the first direction, the other of the second regions extending from a second end of the first region along the first direction, and each of the second regions being thicker than the first region; and
a second electrode provided above the first region and the second regions and extending along the first direction,
wherein a first side end of the substrate, a first side end of the first electrode, a side end of the one of the second regions, and a first side end of the second electrode are flush with each other along a second direction intersecting with the first direction, and
wherein a second side end of the substrate, a second side end of the first electrode, a side end of the other of the second regions, and a second side end of the second electrode are flush with each other along the second direction.

8. The element of claim 7,
wherein a length of the first region in the first direction is not less than 50 mm nor more than 100 mm,
wherein a length of the one of the second regions in the first direction is not less than 5 mm nor more than 15 mm, and
wherein a length of the other of the second regions in the first direction is not less than 5 mm nor more than 15 mm.

9. The element of claim 7, wherein the photoelectric conversion layer contains a polymer material.

10. The element of claim 7, further comprising:
a first intermediate layer provided between the first electrode and the photoelectric conversion layer; and
a second intermediate layer provided between the photoelectric conversion layer and the second electrode.

11. The element of claim 7,
wherein a length of the one of the second regions in the first direction is shorter than a length of the one of the second regions in the second direction, and
wherein a length of the other of the second regions in the first direction is shorter than a length of the other of the second regions in the second direction.

* * * * *